United States Patent [19]
Yamaguchi

[11] 4,119,516
[45] Oct. 10, 1978

[54] CONTINUOUS ELECTROPLATING APPARATUS

[75] Inventor: Seiichi Yamaguchi, Shimizu, Japan

[73] Assignee: Koito Manufacturing Company Limited, Tokyo, Japan

[21] Appl. No.: 842,244

[22] Filed: Oct. 14, 1977

[30] Foreign Application Priority Data

Oct. 16, 1976 [JP] Japan .................................. 51-139190

[51] Int. Cl.² .......................... C25D 5/02; C25D 5/08; C25D 7/06
[52] U.S. Cl. .................................. 204/224 R; 204/15; 204/206
[58] Field of Search .............. 204/15, 224 R, 206–211

[56] References Cited
U.S. PATENT DOCUMENTS

| | | | |
|---|---|---|---|
| 2,244,423 | 6/1941 | Hall | 204/209 |
| 2,395,437 | 2/1946 | Venable | 204/206 |
| 3,496,086 | 2/1970 | Stalson et al. | 204/208 |
| 3,644,181 | 2/1972 | Donaldson | 204/15 |
| 4,030,999 | 6/1977 | Allen | 204/15 |
| 4,053,370 | 10/1977 | Yamashita et al. | 204/15 |

FOREIGN PATENT DOCUMENTS

1,355,333  6/1974  United Kingdom ...................... 204/15
   986 of   1896   United Kingdom .............. 204/DIG. 7

*Primary Examiner*—T. M. Tufariello
*Attorney, Agent, or Firm*—George B. Oujevolk

[57] ABSTRACT

Apparatus useful for the continuous manufacture of metal foil or printed circuit patterns includes a cathode supported over a plating tank with its flat bottom surface disposed horizontally. A continuous strip of basis metal to be plated is fed horizontally over the tank from reel to reel while being held in sliding contact with the bottom surface of the cathode by suction. Within the plating tank a pair of insoluble anodes having a block of electrically insulating material sandwiched therebetween are mounted opposite to the cathode, with a spacing between each anode and the basis metal traveling under the cathode. The insulating block has an upwardly opening groove formed transversely therein, and from this groove the electrolyte solution within the tank is caused to flow turbulently through the spaces between the anodes and the basis metal traveling under the cathode in order to speed the electrodeposition, as of copper, on the downward-facing surface of the basis metal.

7 Claims, 7 Drawing Figures

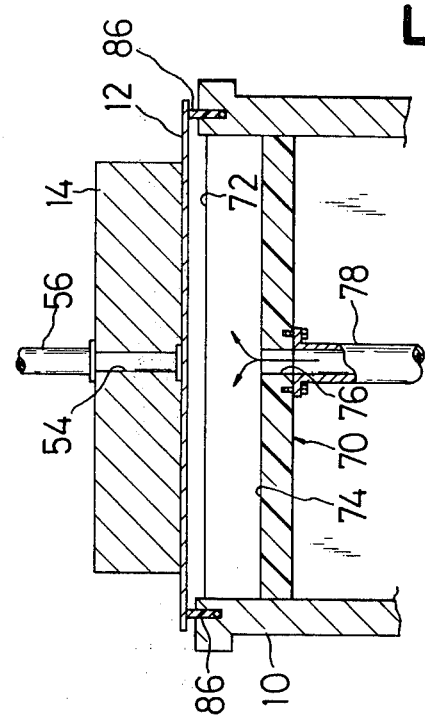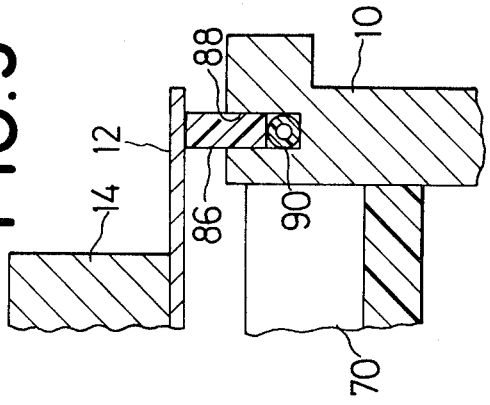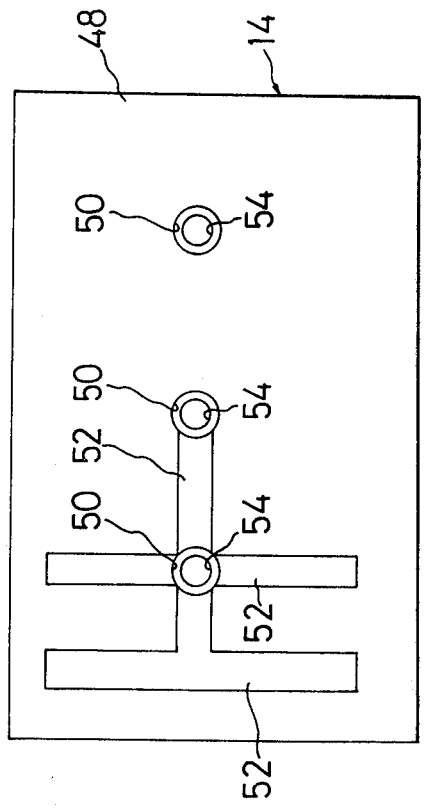

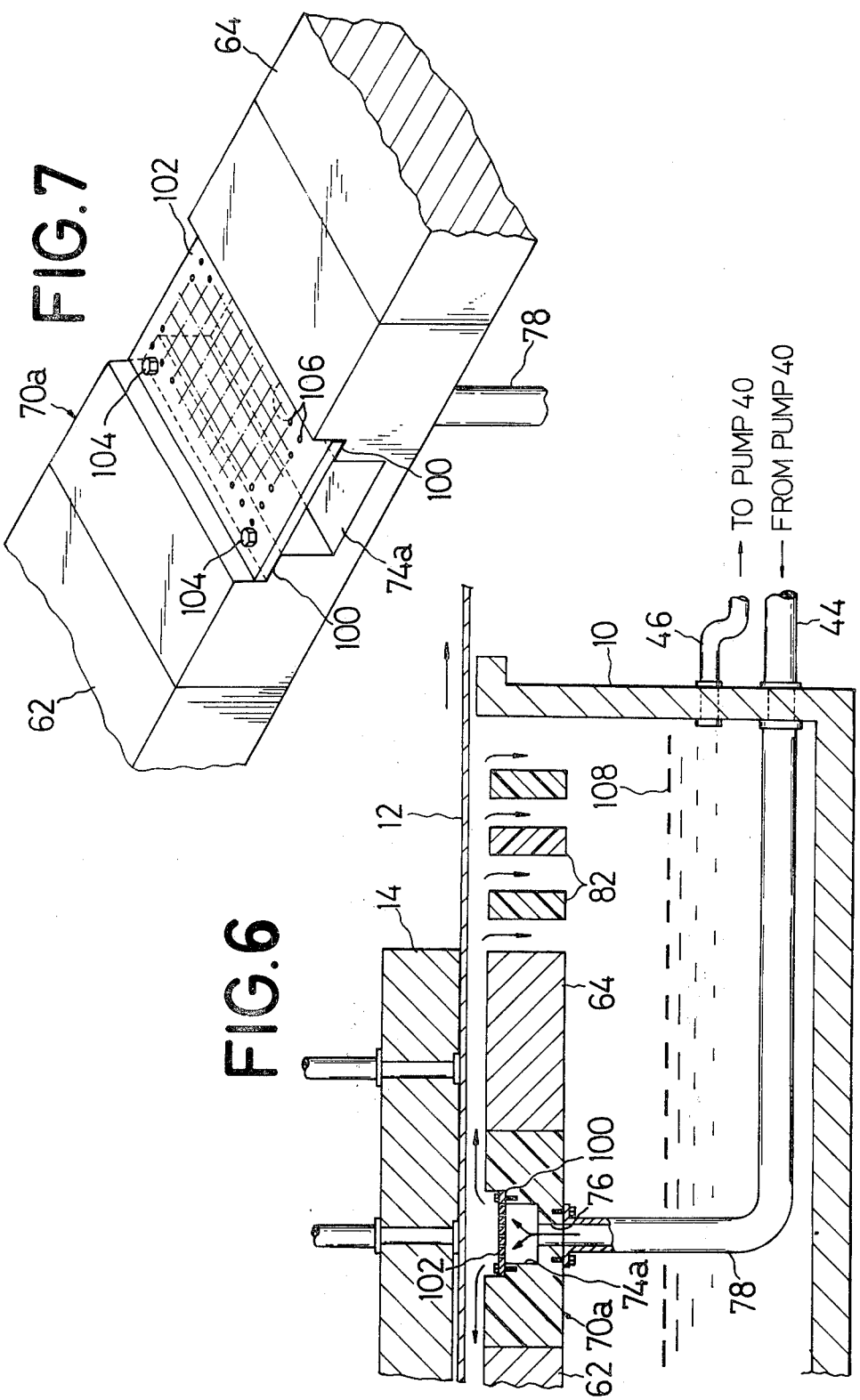

CONTINUOUS ELECTROPLATING APPARATUS

BACKGROUND OF THE INVENTION

1. Field of the Invention

My invention relates to electroplating apparatus and, in particular, to such apparatus especially well adapted for the continuous manufacture of metal foil or printed electronic circuit patterns.

2. Description of the Prior Art

In K. Yamashita et al. U.S. patent application Ser. No. 722,479, filed on Sept. 13, 1976 under the title, "Process for the Fabrication of Printed Circuits", now patent No. 4,053,370, and assigned to the instant assignee, there is disclosed an electroplating apparatus wherein an endless strip of basis metal extends over a pair of rolls one of which is made cathodic in an acid copper bath. Copper is electrodeposited on the basis metal as the latter, traveling over the cathode roll, is held opposite to insoluble anodes in the bath while the electrolyte solution is made to flow turbulently therebetween to realize a high deposition rate. It has later been discovered, however, that this "rotary" electroplating apparatus, on which the mentioned patent is based, has the following problems.

In the "rotary" electroplating apparatus of the above type, the diameter of the cathode roll is determined by the thickness and other properties of the endless strip of basis metal traveling thereover, in accordance with the equation:

$$R = (E \times t/2(1 - \mu^2)S)$$

where R is the diameter of the cathode roll, E is the elastic modulus of the basis metal, $t$ is the thickness of the basis metal, $\mu$ is the Poisson ratio of the basis metal, and S is the fatigue limit of the basis metal. Since the endless strip of basis metal becomes flattened as same travels past the cathode roll of the above defined diameter, the copper or other metal which has been electrodeposited on the curved surface of the basis metal traveling over the cathode roll is subjected, when the basis metal is subsequently flattened, to a stress such that the electrodeposit tends to separate prematurely from the basis metal.

It is also a disadvantage of the prior art apparatus that the thickness of basis metal for use is limited, in relation to the diameter of the cathode roll, in accordance with the above formula. Furthermore, in the "rotary" electroplating apparatus, it is difficult to effectively and durably seal the electroplating tank against the overflow of the electrolyte solution which is caused as aforesaid to flow turbulently between the rotary cathode and the stationary anodes.

SUMMARY OF THE INVENTION

It is an object of my invention to provide improved continuous electroplating apparatus which permits desired metal to be electrodeposited continuously on a strip of basis metal of practically any desired thickness and which obviates the possibility of the electrodeposited metal separating prematurely from the basis metal.

Another object of my invention is to provide electroplating apparatus wherein a plating vessel in use can be effectively and economically sealed against the overflow of the electrolyte solution.

A further object of my invention is to provide electroplating apparatus which is well calculated to realize an extremely high electrodeposition rate of copper or other metal.

A still further object of my invention is to provide electroplating apparatus which is readily adaptable for the manufacture of either metal foil or printed circuit patterns.

These and other objects are accomplished, in accordance with my invention, by electroplating apparatus wherein a continuous or elongate strip of basis metal to be plated is fed horizontally over a plating tank in sliding contact with the flat bottom surface of a cathode supported over the vessel. Within the plating vessel at least one anode is mounted opposite to the bottom surface of the cathode, with a spacing between the anode and the strip of basis metal traveling under the cathode in sliding contact therewith. The apparatus further comprises means for causing the electrolyte solution within the plating vessel to flow turbulently through the space between the anode and the basis metal traveling under the cathode.

By the turbulent flow of the electrolyte solution between the anode and the basis metal, desired metal can be electrodeposited on the downward-facing surface of the basis metal at an extremely high rate, and the high electrodeposition rate thus achieved is a requisite for the successful operation of the continuous electroplating apparatus in accordance with my invention. As set forth in detail hereinbelow, the apparatus includes improved means for causing the electrolyte solution to flow turbulently in the manner optimum for the purposes of the invention.

The above and other objects, features and advantages of my invention and the manner of attaining them will become more readily apparent, and the invention itself will best be understood, from the following description taken together with the accompanying drawings showing some preferred embodiments of the invention.

BRIEF DESCRIPTION OF THE DRAWINGS

FIG. 3 is a fragmentary, vertical, transverse sectional view of the plating vessel taken along the line 3—3 in FIG. 2;

FIG. 4 is a bottom plan view of the cathode used in the apparatus of FIG. 1;

FIG. 5 is an enlarged, fragmentary sectional view taken along the same plane as FIG. 3 and showing in particular the means for sealing the plating vessel of FIGS. 2 and 3 against the overflow of the electrolyte solution;

FIG. 6 is a fragmentary, vertical sectional view corresponding to FIG. 2 and showing another preferred embodiment of my invention; and FIG. 7 is an enlarged, fragmentary perspective view showing in particular the insulating block and the perforated plate mounted thereon in the apparatus of FIG. 6.

DESCRIPTION OF THE PREFERRED EMBODIMENTS

Figure 1:
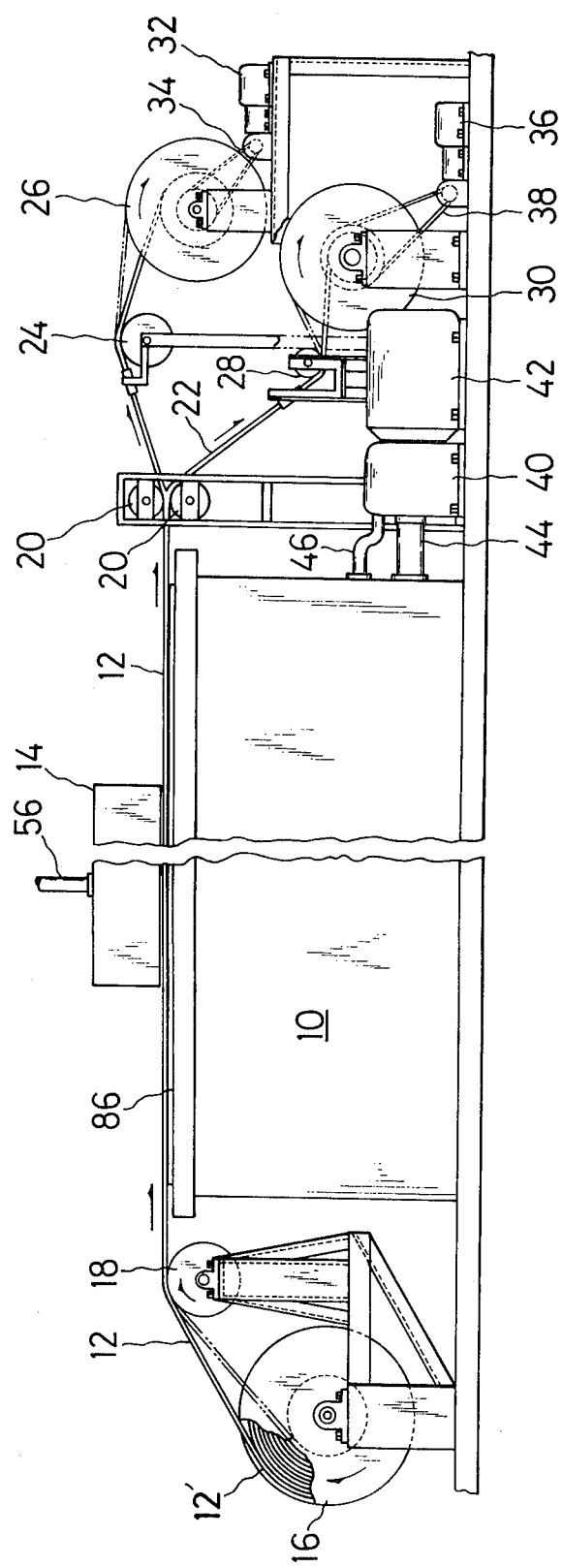
FIG. 1 is an elevational view, partly broken away, of the continuous electroplating apparatus constructed in accordance with my invention.

In FIG. 1 of the drawings the continuous electroplating apparatus in accordance with my invention is shown adapted, by way of example only, for the manufacture of metal foil such as that of copper. The electroplating apparatus includes a plating tank or vessel 10 of the internal configuration of which is shown in detail in FIG. 2. Over this tank 10 a continuous or elongate strip, belt or band of basis metal to be electroplated, such as stainless steel or nickel, is fed horizontally in sliding contact with a cathode 14, as of graphite, that is substantially immovably supported over the tank in any convenient manner.

Unwound from its roll 12' around a payoff reel 16, the strip of basis metal 12 passes over a guide roll 18 and thence over the plating tank 10. As the basis metal 12 travels under and in sliding contact with the cathode 14, while being thereby made cathodic, the desired metal is electrodeposited on its downward-facing surface in the manner hereinafter set forth. Leaving the plating tank 10, the plated basis metal 12 passes between a pair of nip rolls 20, and on emerging from the nip rolls, the electrodeposited metal is stripped from the basis metal in the form of a continuous strip of foil 22.

The strip of basis metal 12 separated from the foil strip 22 subsequently passes over a tension/guide roll 24 and is wound up by and around a takeup reel 26. The foil strip 22, on the other hand, passes under a tension/guide roll 28 and is likewise wound up by and around another takeup reel 30. The first named takeup reel 26 is rotated in a clockwise direction, as viewed in FIG. 1, by a motor drive unit 32 via a chain-and-sprocket arrangement 34, and the second takeup reel 30 is rotated, also in the clockwise direction, by another motor drive unit 36 via a chain-and-sprocket arrangement 38 at synchronous speed with the first takeup reel.

FIG. 1 further shows a pump 40 driven by a motor 42 for circulating the electrolyte solution within the plating tank 10 in the manner described later with particular reference to FIG. 2. The pump 40 has an outlet conduit 44 and an inlet or return conduit 46, both communicating with the interior of the plating tank.

Figure 2:
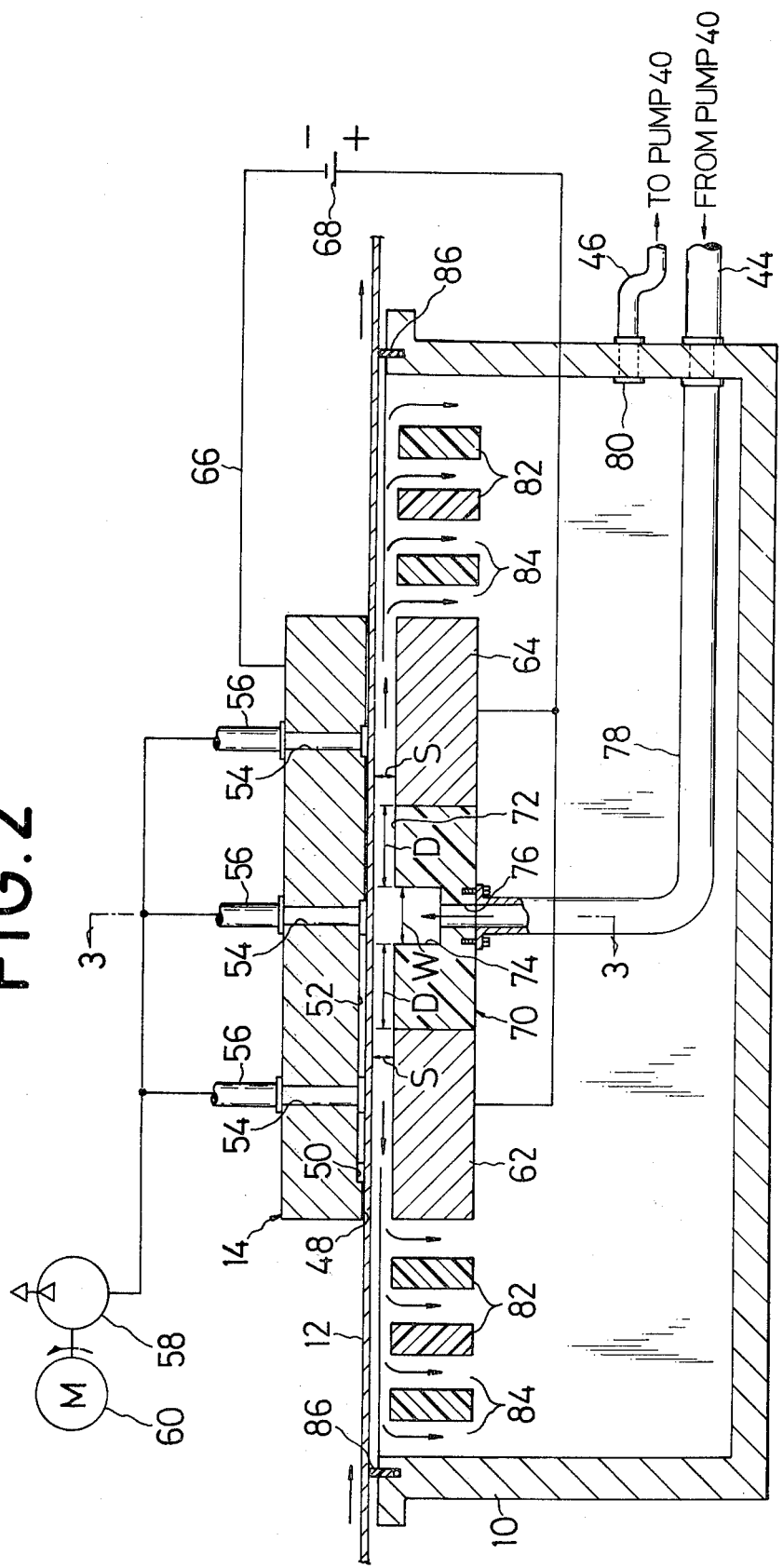
FIG. 2 is an enlarged, vertical, longitudinal sectional view of the plating vessel, together with associated means, used in the apparatus of FIG. 1.

As will be better seen from FIGS. 2 through 4, the cathode 14 has a flat bottom surface 48 disposed horizontally for sliding contact with the basis metal 12 traveling thereunder. This bottom surface 48 of the cathode 14 has formed therein circular depressions 50 and grooves 52 of suitable arrangement, with the grooves being in communication with at least one of the depressions. The illustrated three circular depressions 50 are further in direct communication with respective passageways 54 formed vertically through the cathode 14. These passageways in turn are in communication, via conduits 56 and suitable valving, with a vacuum pump 58 driven by a motor 60.

Thus, as the vacuum pump 58 is set in operation by the motor 60 while the basis metal 12 is being fed under the cathode 14, a partial vacuum is created in the circular depressions 50 and grooves 52 in the bottom surface 48 of the cathode in order to maintain the basis metal in sliding contact therewith by suction and hence to establish proper electrical connection between cathode and basis metal. It is to be noted, however, that the illustrated arrangement of the circular depressions 50 and grooves 52 are purely by way of example; in practice, a depression or depressions of any suitable shape or arrangement may be formed as required in the bottom surface of the cathode.

A pair of insoluble anodes 62 and 64, as of lead, are shown to be mounted within the plating tank 10 in opposed, parallel spaced relationship to the cathode 14, with a comparatively small spacing S between each insoluble anode and the basis metal 12 traveling under the cathode in sliding contact therewith. The anodes 62 and 64 extend across the plating tank 10 and are spaced from each other in the predetermined direction of travel of the basis metal 12 over the tank. A suitable electrical circuit 66 is provided for connecting the cathode 14 and the anodes 62 and 64 to the negative and the positive terminals of a power supply 68 which may be either a generator or rectifier.

Interposed between the pair of insoluble anodes 62 and 64 is a block 70 of electrically insulating material such as polyvinyl chloride, which has a top surface 72 disposed flush with the top surfaces of the anodes. The insulating block 70 has a groove 74 formed in its top surface 72 so as to extend in a direction transverse to the direction of travel of the basis metal 12 over the plating tank 10. The groove 74 has a width W greater than the spacing S between each anode 62 or 64 and the basis metal traveling under the cathode 14, which spacing is of course equal to the spacing between the top surface 72 of the insulating block 70 and the basis metal.

A bore 76 extends vertically downwardly from the midpoint of the groove 74 to communicate the latter with the outlet conduit 44 of the pump 40, FIG. 1, via a conduit 78 which is bent into the shape of an "L" as shown. The inlet conduit 46 of the pump 40 is open at 80 to the interior of the plating tank 10. In this particular embodiment of my invention, the tank 10 is assumed to be filled completely with a desired electrolyte solution, which may contain copper sulfate among other substances.

The electrolyte solution delivered by the pump 40 is therefore forced to flow upwardly through the vertical passageway defined within the plating tank 10 by the insulating block 70 and part of the L-shaped conduit 78, until the flow direction of the solution is turned right-angularly by the basis metal 12 traveling under the cathode 14. On flowing out of the comparatively wide groove 74, therefore, the electrolyte solution enters the narrower spaces between the insulating block 70 and the basis metal 12, on both sides of the groove, and thence flows turbulently into and through the spaces between the anodes 62 and 64 and the basis metal 12 under the cathode 14.

In the continuous electroplating apparatus of my invention, it is desired that the degree of turbulence of the electrolyte solution flowing over the anodes 62 and 64 be constant in a direction transverse to the flow direction of the solution. Toward this end, the dimension D of the portion of the insulating block top surface 72 on each side of the groove 74, as measured in the direction of the solution flow thereover, is made at least about five times the spacing S between each anode 62 or 64 and the basis metal 12 traveling under the cathode 14. Preferably, the spacing S should be in the range of from about 0.2 to about 30.0 millimeters, and the electrolyte solution should flow turbulently over the anodes 62 and 64 at Reynolds numbers above about 2300.

On the downstream side of each of the anodes 62 and 64 there are fixedly mounted a plurality of blocks 82 of electrically insulating material such as polyvinyl chloride. The insulating blocks 82 extend across the plating tank 10 and are substantially constantly spaced from each other and from the anodes 62 and 64 to define passageways 84 through which the electrolyte solution is guided downwardly after flowing turbulently through the spaces between the anodes and the basis metal 12 under the cathode 14.

Means should preferably be provided for inducing the downward flow of the electrolyte solution through the passageways 84, as by suction. It is also desirable to provide means for reconditioning the electrolyte solution within the tank 10. Such incidental means are not specifically illustrated because they are considered to fall within the common knowledge of those skilled in the electroplating art.

As shown in FIGS. 2 and 3 and in greater detail in FIG. 5, sealing strips 86 which may be molded of "Teflon" (trademark for tetrafluoroethylene fluorocarbon polymers) extend along and project upwardly from the top edges of the plating tank 10 for sealing same against bath overflow. Each sealing strip 86 is partly slidably received in a groove 88 formed in and extending along the respective top edge of the plating tank 10, in overlying relationship to a tube 90 of elastic material such as polyvinyl chloride or synthetic rubber.

The sealing strips 86 surrounding the open top of the plating tank 10 as above are intended to make sliding but practically liquid-tight contact with the strip of basis metal 12 traveling thereover. For such proper contact of the sealing strips 86 with the basis metal 12, air or other fluid may be delivered into or drawn out of the elastic tubes 90 within the grooves 88, thereby adjustably moving the sealing strips up or down with respect to the plating tank 10.

Operation

For the manufacture of copper foil, for example, by the continuous electroplating apparatus described hereinabove with reference to FIGS. 1 through 5, the motor drive unit 32 is set in operation to feed the strip of stainless steel or other basis metal horizontally over the plating tank 10 from payoff reel 16 to takeup reel 26 at prescribed constant speed. The basis metal 12 traveling under the cathode 14 can be maintained in sliding contact with its flat bottom surface 48 as the vacuum pump 58 is set in operation to exert suction on the basis metal.

The pump 40 is also set in operation to cause the electrolyte solution containing copper sulfate to flow upwardly into the groove 74 in the insulating block 70 and thence, through the spaces between the insulating block and the basis metal 12 traveling under the cathode 14, turbulently into and through the spaces between the anodes 62 and 64 and the basis metal under the cathode. As mentioned, the degree of turbulence of the electrolyte solution flowing over each anode is substantially constant in the direction transverse to its flow direction. The velocity of the turbulent flow of the electrolyte solution over each anode is preferably at least about 2.0 meters per second.

A direct current is introduced through the anodes 62 and 64 at a desired current density to cause copper electrodeposition on the downward-facing surface of the basis metal 12 traveling under the cathode 14 in sliding contact therewith. The electrolyte solution flowing turbulently at the velocity of about 2.0 meters per second or more through the space of about 0.2 to 30 millimeters between each anode and the cathodic basis metal is effective to prevent any undue decrease in copper ion concentration in the adjacency of the basis metal and hence to speed the electrodeposition of copper thereon.

A strip of copper foil is thus formed continuously on the surface of the basis metal 12 as same travels under the cathode 14. The continuous strip of copper foil 22 is stripped from the basis metal at the pair of nip rolls 20 and is wound up around the takeup reel 30 driven by the motor drive unit 36. Since the strip of basis metal 12 is held exactly horizontally during copper electrodeposition thereon, there is absolutely no possibility of the copper foil separating from the basis metal before the laminate reaches the nip rolls 20.

Modification

In FIGS. 6 and 7 is shown a modification or improvement of the preceding embodiment. This modified electroplating apparatus includes a block 70a of electrically insulating material whose shape slightly differs from that of the insulating block 70 of the preceding embodiment, in that the opposed walls bounding the groove 74a in the insulating block 70a are stepped at 100 so as to make the upper end portion of the groove greater in width. Mounted in this wider upper end portion of the groove 74a is a rectangularly shaped plate member 102 of plastics material which is fastened at 104 to the insulating block 70a and which has formed therein an array of perforations 106 to permit the electrolyte solution to pass therethrough.

The electrolyte solution delivered upwardly into the groove 74a by the pump 40 of FIG. 1 is therefore temporarily filled in the groove portion under the perforated plate 102 and is forced upwardly through its perforations 106. In this manner the degree of turbulence of the electrolyte solution flowing between each anode 62 or 64 and the basis metal 12 under the cathode 14 can be made even more constant in the transverse direction.

Another feature of this modified electroplating apparatus resides in the fact that the plating tank 10 contains the electrolyte solution up to a level, indicated at 108, considerably lower than the anodes 62 and 64 and the insulating blocks 70 and 82. This is advantageous since it is easier to cause the turbulent flow of the electrolyte solution in the desired manner. Also, it is unnecessary to provide means for exerting suction to induce the downward flow of the solution through the passageways between the insulating blocks 82.

The low level of the electrolyte solution within the plating tank 10 has the additional advantage that, as will be noted from FIG. 6, the sealing strips of FIG. 5 need not be provided at those of the top edges of the plating tank which extend transverse to the strip of basis metal 12 traveling thereover. Although not specifically illustrated, the sealing strips are assumed to be mounted on the other two top edges of the plating tank 10. Alternatively, such a pair of sealing strips may be mounted on the anodes 62 and 64 and the insulating block 70a so as to define therebetween the passageways for the turbulent flow of the electrolyte solution. The other details of construction of this modified electroplating apparatus are as set forth above in connection with FIGS. 1 through 5, and its operation is also believed to be clearly apparent from the foregoing.

Although I have shown and described the continuous electroplating apparatus of my invention in terms of its specific forms, I understand that my invention is not to be restricted by the exact details of such disclosure but is inclusive of numerous modifications or variations. For instance, while a pair of insoluble anodes are shown to be provided on opposite sides of the insulating block in the foregoing embodiments, only one such anode may be employed in practice. Furthermore, the apparatus of my invention may be readily adapted for the manufacture of printed circuit patterns, instead of metal foil, by masking the surface of the basis metal with a plating resist as by the known printing process. All these and other changes which come within the meaning and range of equivalence of the appended claims are intended to be encompassed therein.

I claim:

1. An apparatus for continuously electroplating a sheet metal strip of electrically conducting material as the strip is fed longitudinally in a predetermined direction through the apparatus, comprising:
   (a) a plating vessel for receiving an electrolyte solution;
   (b) a cathode having a bottom surface disposed and horizontally supported over the plating vessel, the strip of material being fed under and in sliding contact with said bottom surface of the cathode;
   (c) a pair of insoluble anodes mounted within the plating vessel in opposed relationship to the cathode, with a constant spacing between each anode and the strip traveling under the cathode, the pair of anodes being spaced from each other in the predetermined traveling direction of the strip;
   (d) a block of electrically insulating material sandwiched between the pair of anodes and having a top surface disposed flush with the top surfaces of the anodes, there being a groove in the top surface of the insulating block which extends in a direction transverse to the predetermined traveling direction of the strip and which has a width greater than the spacing between each anode and the strip traveling under the cathode;
   (e) a plate member mounted in the groove in the top surface of the insulating block and having a plurality of openings formed therein; and,
   (f) means for forcibly delivering the electrolyte solution into the groove in the insulating block from under the plate member mounted therein in order to cause turbulent flow of the electrolyte solution through the spacings between the anodes and the strip traveling under the cathode, whereby the degree of turbulence of the electrolyte solution flowing through the spacings between the anodes and the strip is made constant in the transverse direction of the strip as the electrolyte solution forcibly delivered into the groove in the insulating block subsequently flows through the openings in the plate member and over the top surface portions of the insulating block on the opposite sides of the groove.

2. The electroplating apparatus as recited in claim 1, wherein the dimension of the surface of the block of insulating member in the direction of the flow of the electrolyte solution thereover is at least about five times the spacing between the anode and the sheet metal traveling under the cathode.

3. The electroplating apparatus as recited in claim 1, wherein the flat bottom surface of the cathode has a depression formed therein, and wherein the apparatus further comprises means for creating a partial vacuum in the depression, whereby the sheet metal strip traveling under the cathode is maintained in sliding contact with its bottom surface by suction.

4. The electroplating apparatus as recited in claim 1, further comprising means for sealing the plating vessel against the overflow of the electrolyte solution.

5. The electroplating apparatus as recited in claim 4, wherein the sealing means comprises sealing strips extending along and projecting upwardly from at least those of the top edges of the plating vessel which extend along the continuous length of sheet metal traveling thereover, the sealing strips being adapted to make sliding contact with the sheet metal.

6. The electroplating apparatus as recited in claim 5, wherein the sealing strips are partly slidably received in respective grooves formed in the top edges of the plating vessel, and wherein the sealing means further comprises tubes of elastic material which are received in the respective grooves in underlying relationship to the sealing strips, whereby the sealing strips are adjustably movable up or down with respect to the plating vessel as a fluid is delivered into or drawn out of the elastic tubes.

7. The electroplating apparatus as recited in claim 1, wherein the dimension of the top surface portion of the insulating block on each side of the groove formed therein, as measured in the direction of the flow of the electrolyte solution thereover, is at least about five times the spacing between each anode and the sheet metal strip traveling under the cathode.

* * * * *